(12) United States Patent
Kang et al.

(10) Patent No.: US 6,794,711 B2
(45) Date of Patent: Sep. 21, 2004

(54) NON-VOLATILE MEMORY DEVICE HAVING SELECT TRANSISTOR STRUCTURE AND SONOS CELL STRUCTURE AND METHOD FOR FABRICATING THE DEVICE

(75) Inventors: Sung-taeg Kang, Seoul (KR); Jeong-uk Han, Gyeonggi-do (KR); Soeng-gyun Kim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/620,025

(22) Filed: Jul. 14, 2003

(65) Prior Publication Data

US 2004/0046210 A1 Mar. 11, 2004

(30) Foreign Application Priority Data

Sep. 11, 2002 (KR) .................... 10-2002-0055003

(51) Int. Cl.[7] ............................................ H01L 29/788
(52) U.S. Cl. .................. 257/315; 257/239; 257/261; 257/316; 257/318; 257/322; 438/201; 438/211; 438/241; 438/257; 438/261; 438/266
(58) Field of Search ................. 257/239, 261, 257/298, 315–326; 438/201, 211, 216, 241, 257, 258, 260–266, 591, 593

(56) References Cited

U.S. PATENT DOCUMENTS 5,559,735 A * 9/1996 Ono et al. ............... 365/185.3
5,780,893 A * 7/1998 Sugaya ........................ 257/318

* cited by examiner

Primary Examiner—David Nelms
Assistant Examiner—Andy Huynh
(74) Attorney, Agent, or Firm—Marger Johnson & McCollom, P.C.

(57) ABSTRACT

Non-volatile memory devices according to embodiments of the invention can include, for example, a semiconductor substrate, a source region, a drain region, an impurity region, a vertical structure, a control gate insulating layer, a control gate electrode, a gate insulating layer, and a gate electrode. The impurity region is in a floating state between the source region and the drain region. The vertical structure is formed of a tunneling layer, a charge trapping layer, and a blocking layer sequentially stacked between the source region and the impurity region. The control gate insulating layer is between the source region and the impurity region and adjacent to the vertical structure. The control gate electrode is formed on the vertical structure and the control gate insulating layer. The gate insulating layer is between the impurity region and the drain region. The gate electrode is formed on the gate insulating layer.

15 Claims, 14 Drawing Sheets

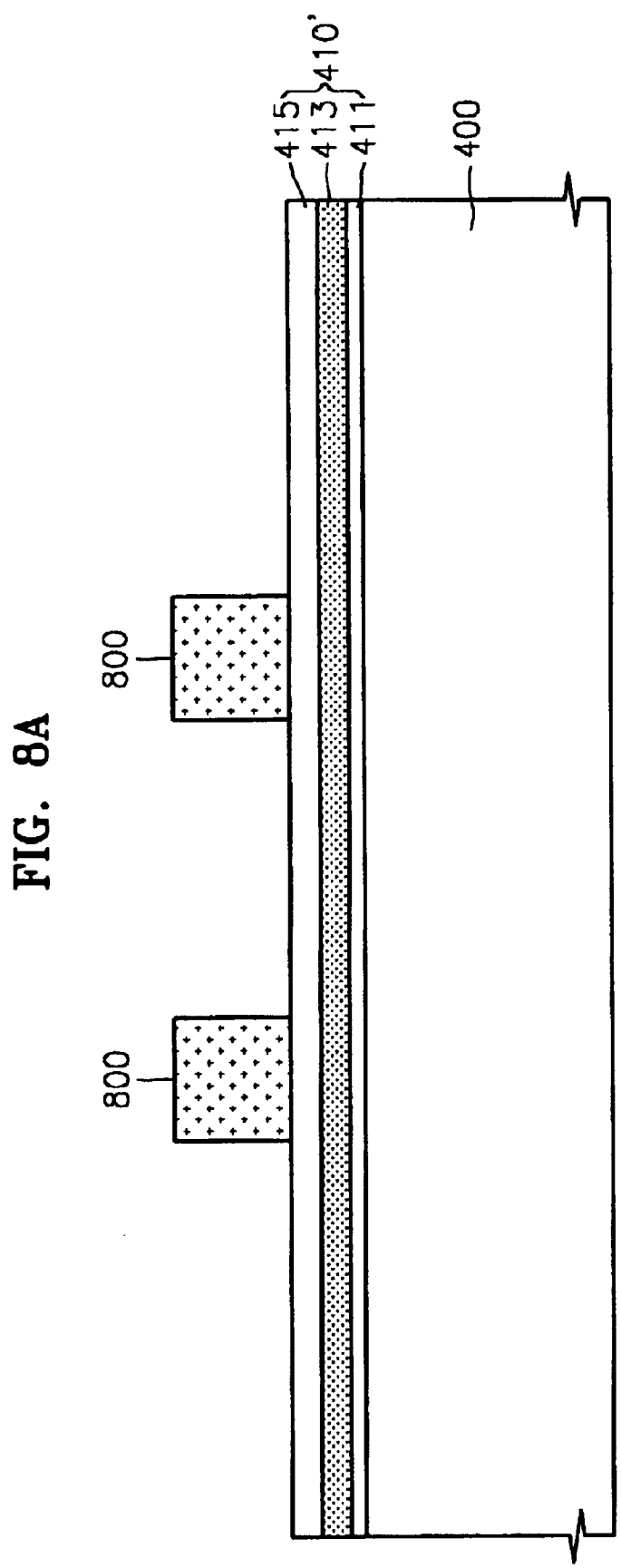

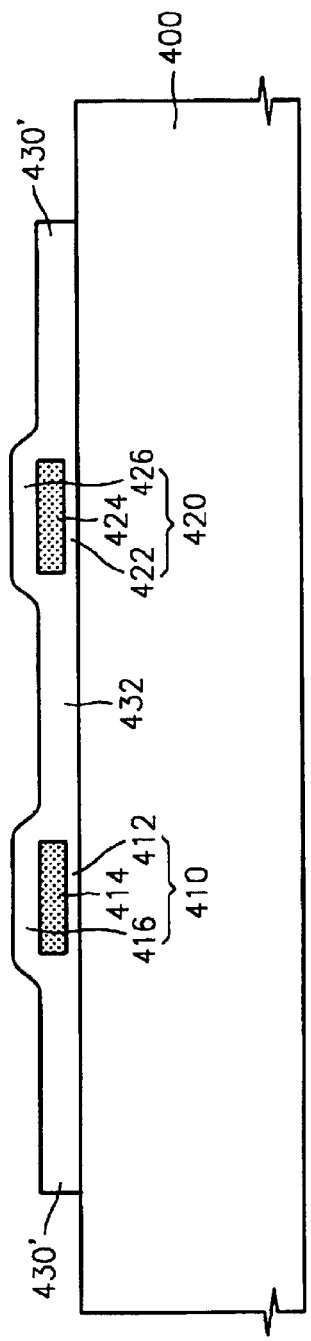
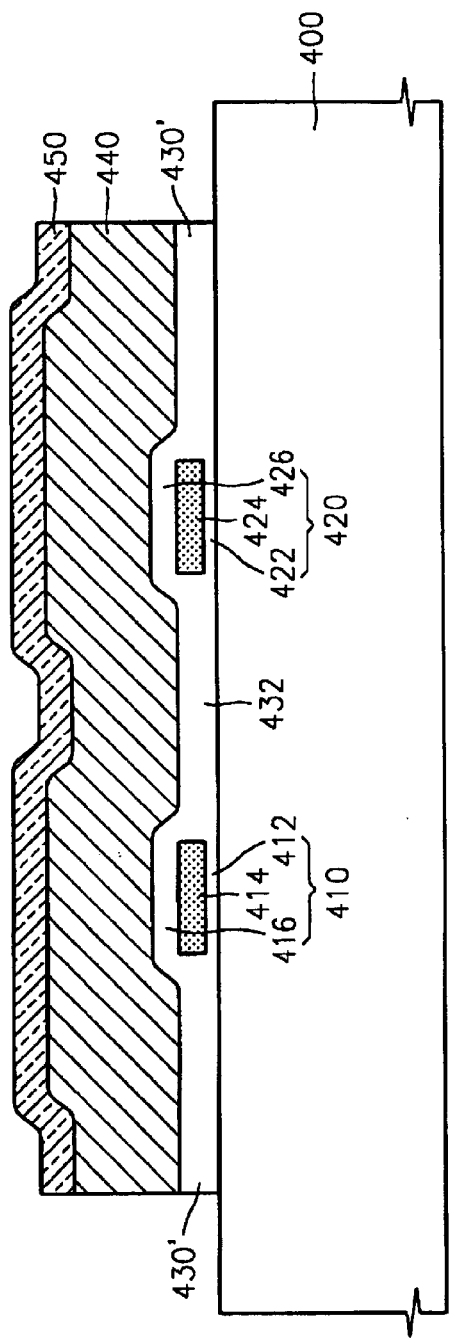

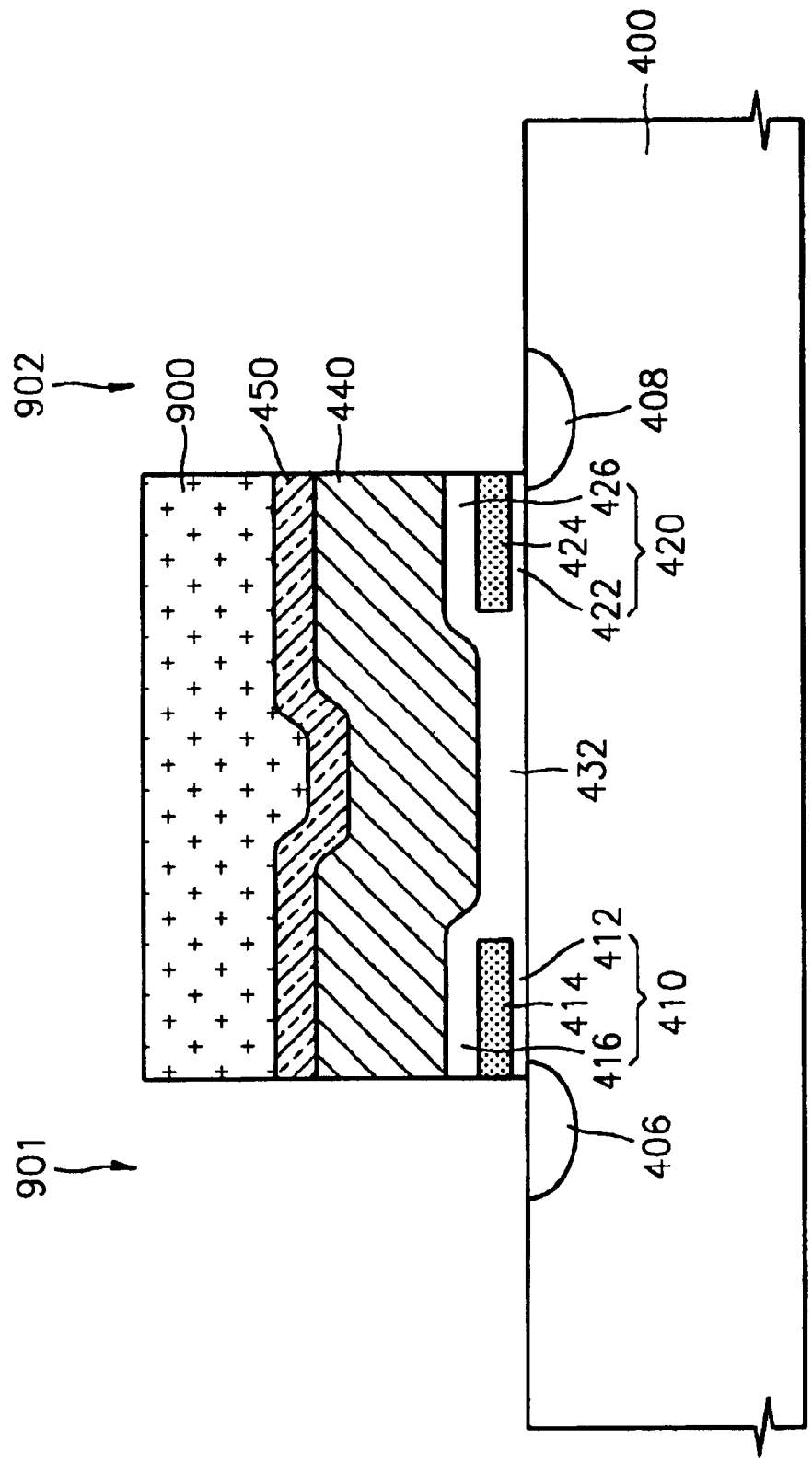

NON-VOLATILE MEMORY DEVICE HAVING SELECT TRANSISTOR STRUCTURE AND SONOS CELL STRUCTURE AND METHOD FOR FABRICATING THE DEVICE

CROSS REFERENCE TO RELATED APPLICATIONS

This application claims priority from Korean Patent Application No. 2002-55003, filed Sep. 11, 2002, in the Korean Intellectual Property Office, the contents of which are hereby incorporated by reference in its entirety.

BACKGROUND OF THE INVENTION

1. Technical Field of the Invention This disclosure relates to a non-volatile memory device and a method for fabricating the device, and more particularly, to a non-volatile memory device having a select transistor structure and silicon-oxide-nitride-oxide-silicon (SONOS) cell structure and a method for fabricating the device.

2. Description of the Related Art

In general, semiconductor memory devices used for storing data can be divided into volatile devices and non-volatile devices. Volatile memory devices lose data stored therein when a supply voltage is interrupted, while non-volatile memory devices retain the data stored therein even if the supply voltage is interrupted. Accordingly, non-volatile memory devices are widely used when the supply voltage is not always applied or often interrupted, or when a device requires only a low voltage, such as a mobile telephone, a memory card for storing music and/or image data, and other application devices.

In general, cell transistors of the non-volatile memory device have a stacked gate structure. The stacked gate structure includes a gate insulating layer which is sequentially stacked on a channel region of the cell transistor, a floating gate electrode, an insulating layer between gates, and a control gate electrode. The non-volatile memory device often can be formed of a silicon layer in which a channel region is formed, an oxide layer which forms a tunneling layer, a nitride layer which is used as a charge trapping layer, an oxide layer which is used as a blocking layer, and a silicon layer which is used as a control gate electrode. This structure is often referred to as a silicon-oxide-nitride-oxide-silicon (or SONOS) cell structure.

FIG. 1 is a sectional diagram of a non-volatile memory device having a general SONOS cell structure.

With reference to FIG. 1, an oxide-nitride-oxide (ONO) layer 110 is formed on a silicon substrate 102 where a source region 104 and a drain region 106 are separated from each other by a predetermined distance. The ONO layer 110 has a stacked structure, which is formed such that a tunneling layer 112 formed of a first silicon oxide layer, a charge trapping layer 114 formed of a silicon nitride layer, and a blocking layer 116 formed of a second silicon oxide layer are sequentially stacked on a surface of the silicon substrate 102. A control gate electrode 120, which is formed of a polysilicon layer, is formed on the ONO layer 110.

In the non-volatile memory device, to perform a programming or writing operation, a positive bias voltage is applied to the control gate electrode 120 and the drain region 106, and the source region 104 is grounded. The voltage that is applied to the control gate electrode 120 and the drain region 106 induces a vertical electric field and a horizontal electric field along the channel region from the source region 104 to the drain region 106. Due to the electric fields, electrons are pushed away from the source region 104 and accelerate towards the drain region 106. The electrons gain energy from moving along the channel region, and some electrons enter into a hot state where they can gain enough energy to enter the charge trapping layer 114, leaping over the potential barrier of the tunneling layer 112. This happens most frequently near the drain region 106, because the electrons can gain the greatest amount of energy in that region. Once the electrons in the hot state enter the charge trapping layer 114, the electrons in the hot state are trapped in the charge trapping layer 114 and become stored therein, and thus the threshold voltage of the memory cell increases.

In the non-volatile memory device, to perform an erasing operation, a different voltage from the voltage used in programming or reading the memory cell is required. For example, a positive bias voltage is applied to the drain region 106, and a negative bias voltage is applied to the control gate electrode 120. Then, the source region 104 is floated. Thus, the electrons, which are stored in the charge trapping layer 114, move towards the drain region 106, and holes within the drain region 106 migrate to the charge trapping layer 114. Therefore, the electrons stored in the charge trapping layer 114 are removed or neutralized by the holes, and thus data on the memory cell is erased.

However, the non-volatile memory device having the above-mentioned structure cannot control a current in the channel region when the programming operation is performed in byte mode. That is, the programming operation must be performed in bit mode, and a certain amount of power is continuously wasted because the current in the channel region cannot be controlled when the operation is executed.

Embodiments of the invention address this and other limitation in the product.

SUMMARY OF THE INVENTION

Embodiments of the invention provide a non-volatile memory device having a select transistor structure and a SONOS cell structure which make it possible to perform programming operation in byte mode and to control a current in a channel region when the programming operation is executed. Also provided is a method for manufacturing the non-volatile memory device.

BRIEF DESCRIPTION OF THE DRAWINGS

The above and other features and advantages of the invention will become more apparent by describing in detail preferred embodiments thereof with reference to the attached drawings.

FIGS. 8A through 8D are sectional diagrams illustrating a method for fabricating the non-volatile memory device of FIG. 4.

FIGS. 9A through 9C are sectional diagrams illustrating a method for fabricating the non-volatile memory device of FIG. 5.

DETAILED DESCRIPTION OF THE INVENTION

The invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
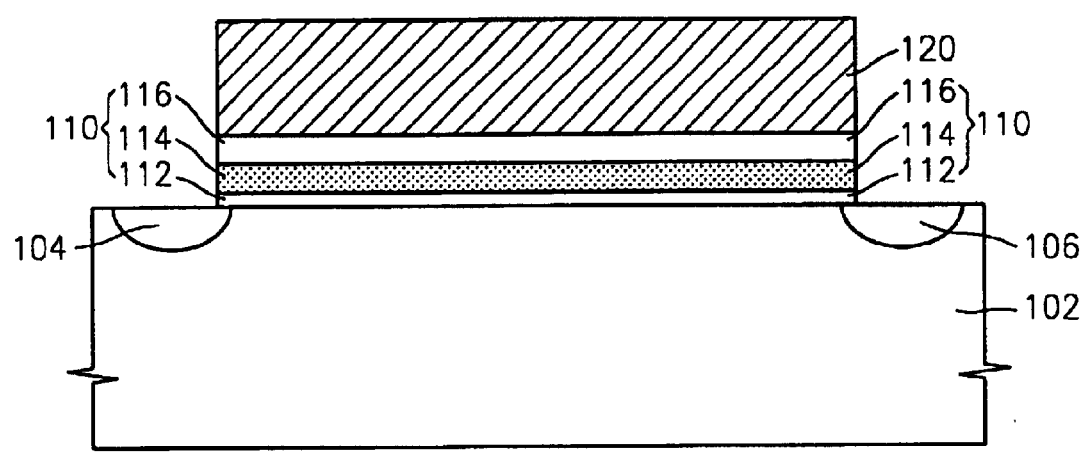
FIG. 1 is a sectional diagram of a non-volatile memory device having a general SONOS cell structure.
Figure 2:
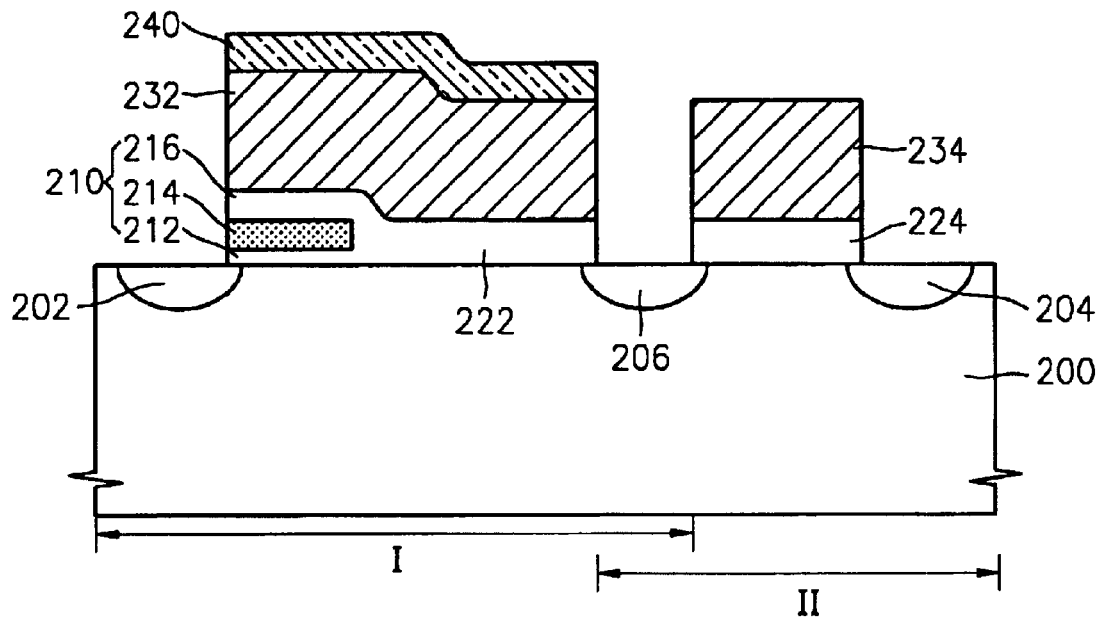
FIG. 2 is a sectional diagram of a non-volatile memory device having a select transistor structure and a SONOS cell structure, according to an embodiment of the invention.

FIG. 2 is a sectional diagram of a non-volatile memory device having a select transistor structure and a SONOS cell structure according to an embodiment of the invention.

With reference to FIG. 2, a cell of a non-volatile memory device includes a SONOS cell I and a select transistor II on a silicon semiconductor substrate 200. A source region 202 and a drain region 204 are separated from each other by a predetermined distance on the semiconductor substrate 200, and an impurity region 206 is placed between the source region 202 and the drain region 204.

A vertical structure 210 and a gate insulating layer 222 are placed relatively close together. The vertical structure 210 is constructed by sequentially stacking a tunneling layer 212, a charge trapping layer 214, and a blocking layer 216 on the surface of the semiconductor substrate 200 between the source region 202 and the impurity region 206. The vertical structure 210 is located near the source region 202. The tunneling layer 212, the blocking layer 216, and the gate insulating layer 222 are oxide layers, and the charge trapping layer 214 is a nitride layer. A control gate electrode 232 is formed on the blocking layer 216 and the gate insulating layer 222. The control gate electrode 232 is formed of a polysilicon layer, and a metal silicide layer 240 is formed on the control gate electrode 232. The metal silicide layer 240 reduces the word line resistance in the memory array.

A gate insulating layer 224 of the select transistor II is formed on the semiconductor substrate 200 between the drain region 204 and the impurity region 206. The gate electrode 234 of the select transistor II is formed on the gate insulating layer 224. The gate insulating layer 224 is an oxide layer, and the gate electrode 234 is formed of a polysilicon layer.

The impurity region 206 may be used for both the SONOS cell I and the select transistor II, and it is always in a floating state. Since the impurity region 206 is always in a floating state, it functions as a medium for transferring a current between the source region 202 and the drain region 204. More specifically, an inversion layer is formed between the drain region 204 and the impurity region 206 based on whether a bias voltage is applied to the gate electrode 234 of the select transistor II or not. That is, if a positive bias voltage is applied to the gate electrode 234, an inversion layer is formed between the drain region 204 and the impurity region 206, and thus a channel, i.e., a path that a current moves through, is formed. On the other hand, if a bias voltage is not applied to the gate electrode 234, an inversion layer is not formed between the drain region 204 and the impurity region 206, and thus a channel is not formed. That is, the path through which a current moves between the drain region 204 and the impurity region 206 does not exist.

If a channel does not exist between the drain region 204 and the impurity region 206, a programming operation of the SONOS cell I is not performed. That is, although an appropriate bias voltage is applied to the control gate electrode 232 and the source region 202 of the SONOS cell I (e.g., a voltage of about 7.5V is applied to the control gate electrode 232 and a voltage of about 6.5V is applied to the source region 202) to perform a programming operation of the non-volatile memory cell, the programming operation is not performed because a carrier is not supplied to the impurity region 206 unless the select transistor II is turned on to form a channel region between the drain region 204 and the impurity region 206. On the other hand, if the select transistor II is turned on and a channel is formed between the drain region 204 and the impurity region 206, carriers are constantly provided to the impurity region 206 from the drain region 204. Then, the carriers which are supplied to the impurity region 206, i.e., electrons, move towards the source region 202 due to the horizontal and vertical electric fields, and some electrons enter a hot state and are trapped in the charge trapping layer 214. In this manner the programming operation is performed.

As described above, the programming operation of the SONOS cell I is performed according to the state of the select transistor II. Therefore, it is possible to program the SONOS cell I in byte units rather than in bit units according to the use of the select transistor If the select transistor II is turned on, and an appropriate bias voltage is applied to the control gate 232 and the source region 202 of the SONOS cell I such that the programming operation is performed, the current between the impurity region 206 and the source region 202 is affected by the current between the drain region 204 and the impurity region 206. In addition, the current between the drain region 204 and the impurity region 206 can be changed according to the bias voltage applied to the gate electrode 234 of the select transistor II. Accordingly, in the non-volatile memory device according to an embodiment of the invention, it is possible to reduce the amount of the current consumed when the programming operation is performed by controlling the bias voltage applied to the gate electrode 234 of the select transistor II. Consequently, the power wasted when the programming operation is performed can be reduced.

In order to erase data on the non-volatile memory device, a hot hole erase (HHE) method is generally used, but other methods can be used instead. When data on the non-volatile memory device is erased by the HHE method, a breakdown is induced near the source region 202 by applying a negative bias voltage (e.g., −7.5V) to the control gate electrode 232 and a positive bias voltage (e.g., 6.5V) to the source region 202. If the breakdown occurs, many carriers are generated near the source region 202, and some holes among the carriers are trapped in the charge trapping layer 214 by the vertical electric field. The trapped holes in the charge trapping layer 214 are combined with the electrons, which have been already trapped in the charge trapping layer 214, thereby reducing the threshold voltage. During this period, the select transistor II is maintained in an off state.

Figure 3:
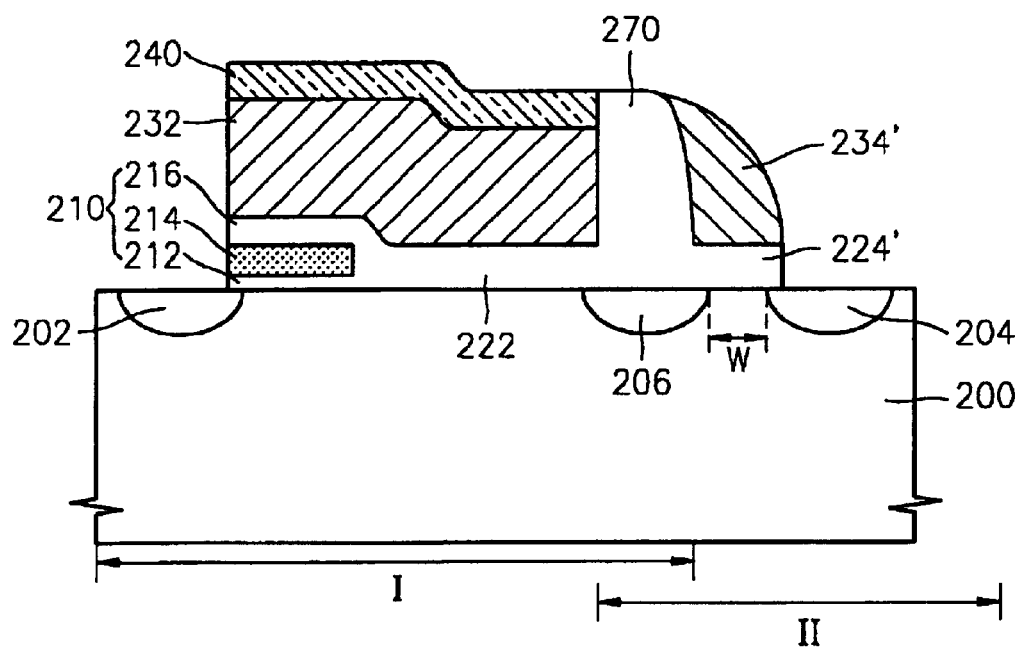
FIG. 3 is a sectional diagram of a non-volatile memory device having a select transistor structure and a SONOS cell structure, according to another embodiment of the invention.

FIG. 3 is a sectional diagram of a non-volatile memory device having a select transistor structure and a SONOS cell structure according to another embodiment of the invention.

The non-volatile memory device shown in FIG. 3 includes a SONOS cell structure I and a select transistor structure II, similar to the non-volatile memory device shown in FIG. 2. The SONOS cell structure I and the select transistor structure II share the impurity region 206 in a floating state. The overall structure is similar to the non-volatile memory device of FIG. 2, and descriptions on like reference numerals will be omitted here. Therefore, only differences between the structures of FIG. 2 and FIG. 3 will be explained. The programming operation and the erasing operation are similar to each other, and thus the descriptions thereof will not be described.

With reference to FIG. 3, a gate electrode 234' of the select transistor II is formed on a gate insulating layer 224' at a sidewall of an insulating layer spacer 270. It can be noticed that the width w of the gate electrode 234' is smaller than the gate electrode 234 of the select transistor II in FIG. 2, and thus the integration density of the device can be improved. When the gate electrode 234 of the select transistor II in FIG. 2 is formed, a photolithography process is inevitably performed, which affects the width of the gate electrode 234 because of the limitations of the photolithography process. However, when the gate electrode 234' of the select transistor II in FIG. 3 is formed, the gate electrode 234' formed of the polysilicon layer may be wholly etched rather than performing the photolithography process, and thus the width of the gate electrode 234' is not affected by limitations of the photolithography process.

Figure 4:
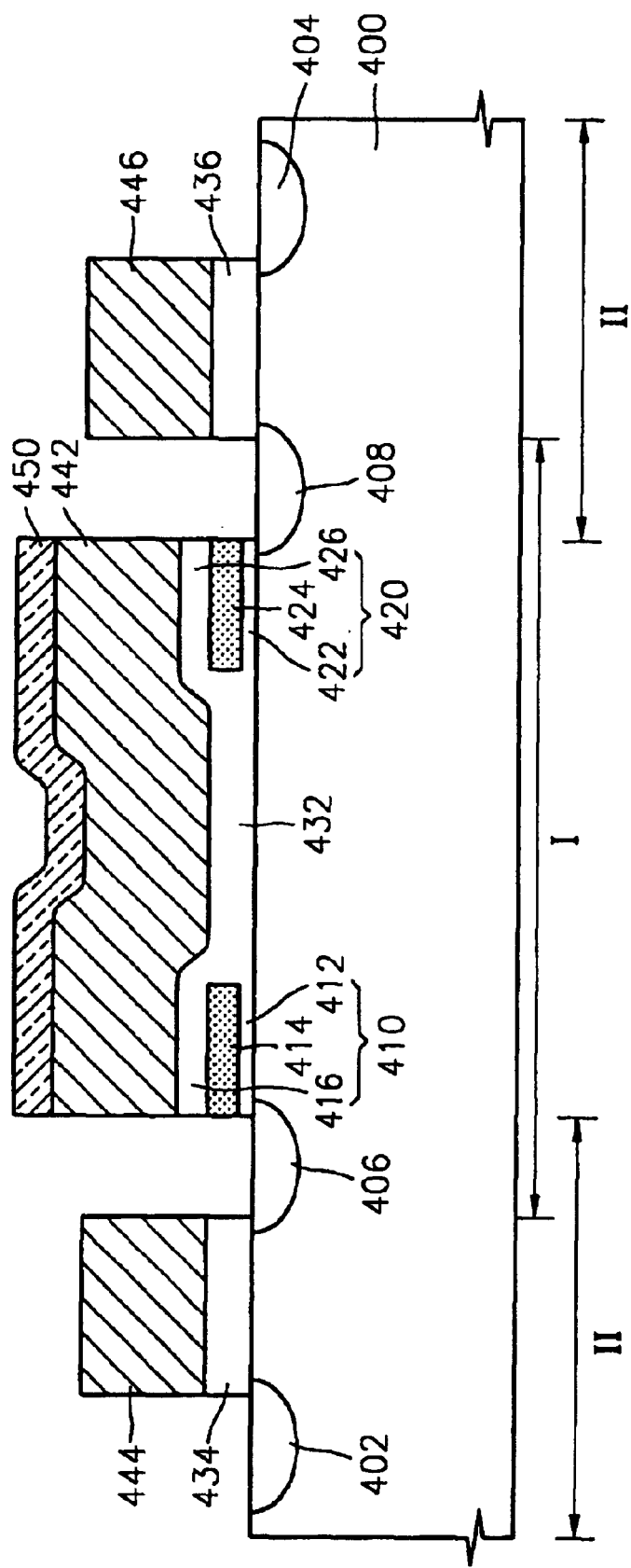
FIG. 4 is a sectional diagram of a non-volatile memory device having a select transistor structure and a SONOS cell structure, according to yet another embodiment of the invention.

FIG. 4 is a sectional diagram of a non-volatile memory device having a select transistor structure and a SONOS cell structure according to yet another embodiment of the invention.

With reference to FIG. 4, the non-volatile memory device according to this embodiment includes a SONOS cell structure I and two select transistors structures, i.e., a first select transistor II and a second select transistor III. The SONOS cell structure I includes a first vertical structure 410 and a second vertical structure 420 which are separated from each other. The first and the second vertical structures 410 and 420 are formed with an ONO structure. The SONOS cell structure I and the first and second select transistors II and III are formed on a silicon semiconductor substrate 400. On a certain area of the semiconductor substrate 400, a source region 402 and a drain region 404 are formed separated from each other. Between the source region 402 and the drain region 404, two impurity regions, i.e., a first impurity region 406 and a second impurity region 408, are formed. The first impurity region 406 is placed on a region between the SONOS cell structure I and the first select transistor II. The second impurity region 408 is placed on a region between the SONOS cell structure I and the second select transistor II. The first and the second impurity regions 406 and 408 continue to be in a floating state.

The SONOS cell structure I includes the first vertical structure 410, a gate insulating layer 432, and the second vertical structure 420, which are aligned linearly between the first impurity region 406 and the second impurity region 408 on the semiconductor substrate 400. The first vertical structure 410 is formed such that a first tunneling layer 412, a first charge trapping layer 414, and a first blocking layer 416 are sequentially stacked on the semiconductor substrate 400. Likewise, the second vertical structure 420 is formed such that a second tunneling layer 422, a second charge trapping layer 424, and a second blocking layer 426 are sequentially stacked on the semiconductor substrate 400. The first vertical structure 410 is disposed near the first impurity region 406, and the second vertical structure 420 is disposed near the second impurity region 408. The gate insulating layer 432 is thinner than the first and second vertical structures 410 and 420. A control gate electrode 442 is formed on the first vertical structure 410, the second vertical structure 420, and the gate insulating layer 432. A metal silicide layer 450 is formed on the control gate electrode 442.

The first select transistor structure II includes a first gate insulating layer 434 between the source region 402 and the first impurity region 406 and a first gate electrode 444 on the first gate insulating layer 434. Likewise, the second select transistor structure III includes a second gate insulating layer 436 between the second impurity region 408 and the drain region 404 and a second gate electrode 446 on the second gate insulating layer 436.

In the aforementioned non-volatile memory device, 2-bit data can be stored in one cell. This is because the electrons or holes can be trapped separately in the first charge trapping layer 414 and the second charge trapping layer 424. Here, the bit that includes the first charge trapping layer 414 is referred to as a left bit, and the bit which includes the second charge trapping layer 424 is referred to as a right bit. The non-volatile memory devices of FIG. 2 and FIG. 3 are similar except that programming and reading the non-volatile memory device are performed independently from programming and reading each bit. Erasing data on the non-volatile memory device of FIG. 3 is different from erasing data on the non-volatile memory device of FIG. 2 in that data on the non-volatile memory device of FIG. 2 is erased by using Fowler-Nordheim (F-N) tunneling.

In order to program the left bit of the non-volatile memory cell, 7.5V and 6.5V are applied to the control gate electrode 442 and the source region 402, respectively. These bias voltages are just examples, and other bias voltage may be applied to the control gate electrode 442 and the source region 402. The drain region 404 is grounded. Since the second select transistor III is required to be turned on, the bias voltage is applied to the second gate electrode 446 of the second select transistor m. At this time, a channel is formed between the second impurity region 408 and the drain region 404, and the vertical and horizontal electric fields are induced between the first impurity region 406 and the second impurity region 408. Due to the electric fields, the electrons are accelerated towards the first impurity region 406 from the second impurity region 408, and some electrons reach a hot state such that they are trapped in the first charge trapping layer 414. As described above, the program for the left bit is performed from right to left (hereinafter referred to as a first direction).

Likewise, in order to program the right bit of the non-volatile memory cell, 7.5V and 6.5V are applied to the control gate electrode 442 and the source region 402, respectively. These bias voltages are just examples, and thus other bias voltage may be applied to the control gate electrode 442 and the source region 402. The source region 402 is grounded. Since the second select transistor III is required to be turned on, the bias voltage is applied to the first gate electrode 444 of the second select transistor I. At this time, a channel is formed between the source region 402 and the first impurity region 408, and the vertical and horizontal electric fields are induced between the first impurity region 406 and the second impurity region 408. Due to the electric fields, the electrons are accelerated to move towards the second impurity region 408 from the first impurity region 406, and some electrons reach a hot state such that they are trapped in the second charge trapping layer 424. As described above, the program for the right bit is performed from left to right (hereinafter referred to as a second direction).

In order to read the left bit of the non-volatile memory cell, predetermined bias voltages are applied to the control gate electrode 442 and the source region 402. The bias voltages are required to be greater than the voltages applied when the programming operation is performed. The drain region 404 is grounded. Since the second select transistor m is required to be turned on, the bias voltage is applied to the first gate electrode 444 of the first select transistor II. Therefore, the left bit is read in the second direction.

Likewise, in order to read the right bit of the non-volatile memory cell, predetermined bias voltages are applied to the control gate electrode 442 and the source region 402. The bias voltages are smaller than the voltages applied when the programming operation is performed. The drain region 404 is grounded. Since the second select transistor III is turned on, the bias voltage is applied to the second gate electrode 446 of the second select transistor m. Therefore, the right bit is read in the first direction.

Figure 5:
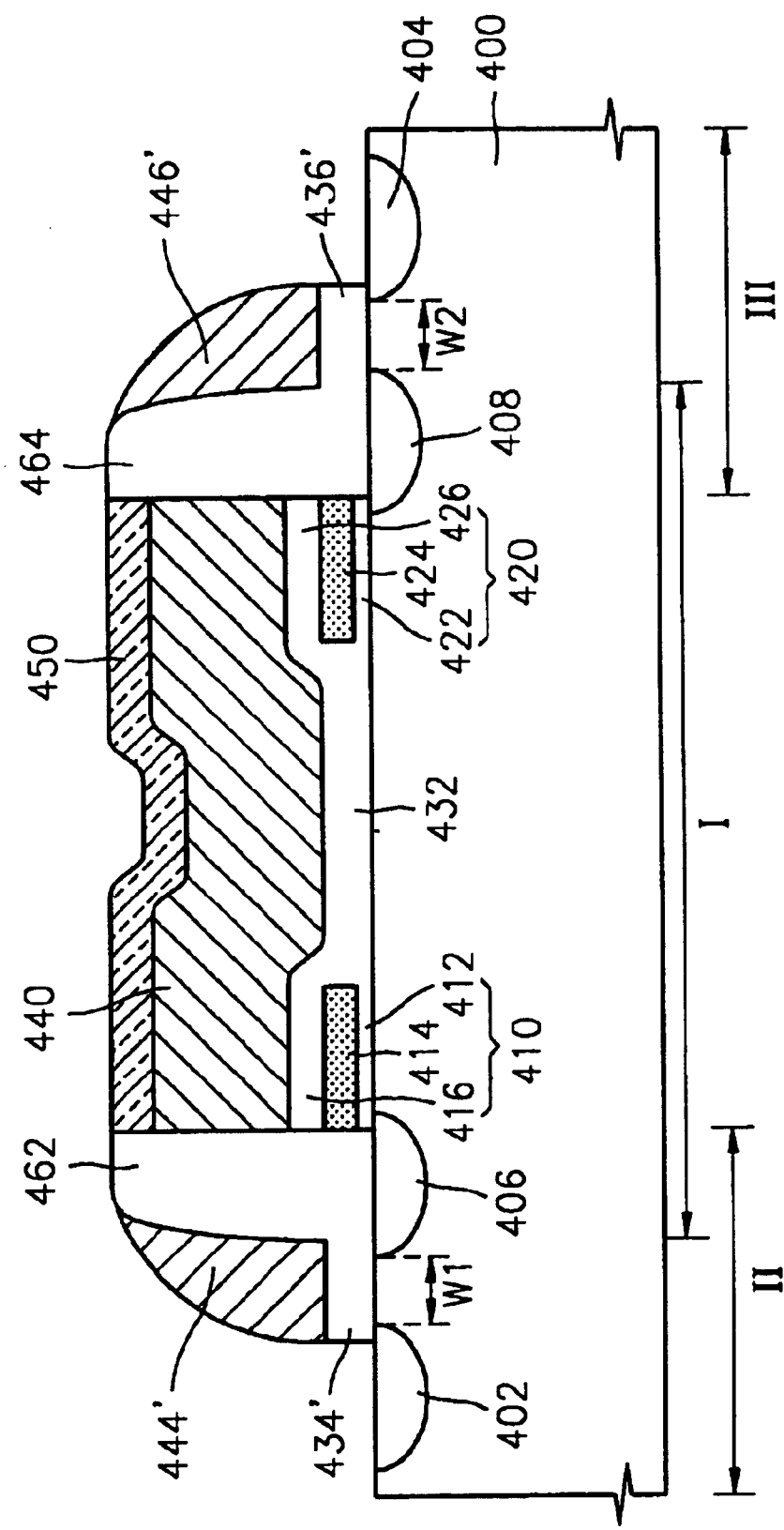
FIG. 5 is a sectional diagram of a non-volatile memory device having a select transistor structure and a SONOS cell structure, according to still another embodiment of the invention.

FIG. 5 is a sectional diagram of a non-volatile memory device having a select transistor structure and a SONOS cell structure according to still another embodiment of the invention.

The non-volatile memory device according to this embodiment includes a SONOS cell structure I and two select transistors structures, i.e., a first select transistor II and a second select transistor m. Their overall structures are similar to the non-volatile memory device of FIG. 4, and thus descriptions about like reference numerals will be omitted. Therefore, only differences in the structures between FIG. 5 and FIG. 4 will be explained. The programming operation and the erasing operation are similar to each other, and thus the descriptions thereof will not be described.

With reference to FIG. 5, a first gate electrode 444' of the first select transistor II is formed at a sidewall of a first insulating layer spacer 462 on a first gate insulating layer 434' in the form of a sidewall spacer. It can be noted that the width w1 of the first gate electrode 444' is smaller than the width w of the first gate electrode 444 of the first select transistor II included in the non-volatile memory device of FIG. 4, and thus the integration density of the device may be improved. When the first gate electrode 444 of the first select transistor II in FIG. 4 is formed, a photolithography process is inevitably performed, which affects the width of the gate electrode 444 because of the limitations of the photolithography process. However, when the first gate electrode 444' of the first select transistor II in FIG. 5 is formed, the first gate electrode 444' formed of the polysilicon layer is required to be entirely etched rather than performing the photolithography process, and thus the width of the gate electrode 444' is not affected by the limitations of the photolithography process.

Likewise, a second gate electrode 446' of the second select transistor m is formed on a second gate insulating layer 436' at a sidewall of a second insulating layer spacer 464. It can be noticed that the width w2 of the second gate electrode 446' is smaller than the second gate electrode 446 of the second select transistor III of FIG. 4, and thus the integration density of the device can be improved. When the second gate electrode 446 of the second select transistor III in FIG. 4 is formed, a photolithography process is inevitably performed, which affects the width of the second gate electrode 446 because of the limitations of the photolithography process. However, when the second gate electrode 446' of the second select transistor III of FIG. 5 is formed, the second gate electrode 446' formed of the polysilicon layer is required to be entirely etched rather than performing the photolithography process, and thus the width of the second gate electrode 446' is not affected by the limitations of the photolithography process.

FIGS. 6A through 6D are sectional diagrams helpful in explaining a method for fabricating the non-volatile memory device of FIG. 2.

Figure 6A:
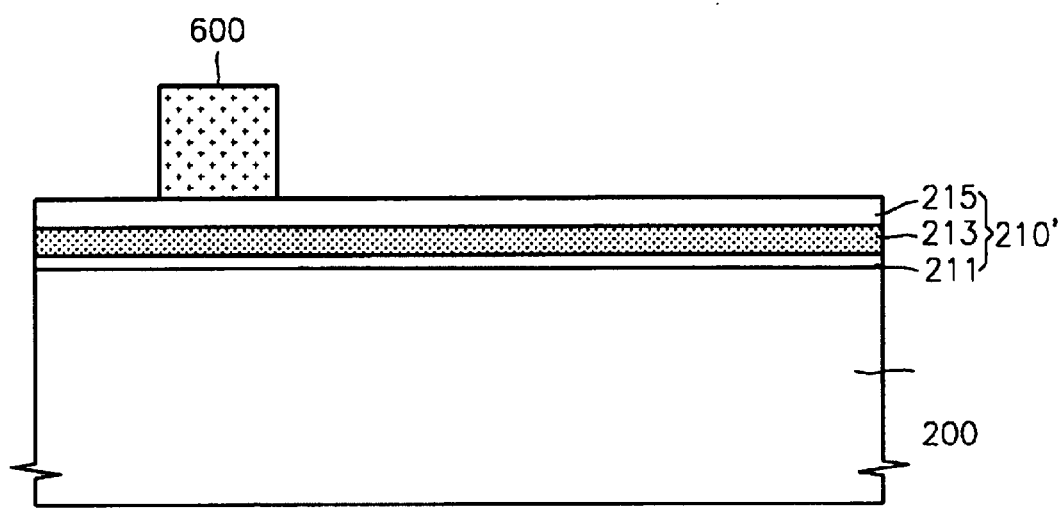
FIGS. 6A through 6D are sectional diagrams illustrating a method for fabricating the non-volatile memory device of FIG. 2.

With reference to FIG. 6A, an ONO layer 210' is formed on a silicon semiconductor substrate 200. The ONO layer 210' is formed such that a silicon oxide tunneling layer 211, a nitride charge trapping layer 213, and a silicon oxide blocking layer 215 are sequentially stacked on the semiconductor substrate 200. In one embodiment, the tunneling layer 211 can be formed by applying thermal oxidation to the semiconductor substrate 200. The thermal oxidation can be executed under an atmosphere including nitrogen, such as $N_2O$ gas or NO gas, and thus the tunneling layer 211 may be an oxynitride layer. The charge trapping layer 213 and the blocking layer 215 can be formed by low-pressure chemical vapor deposition (LPCVD). The charge trapping layer 213 can be also formed by applying nitridation to the tunneling layer 211. After the ONO layer 210' is formed, a mask layer pattern, e.g., a photoresist layer pattern 600, is formed on the blocking layer 215. The photoresist layer pattern 600 partially covers a surface of the blocking layer 215 and exposes other portions of the surface.

Figure 6B:
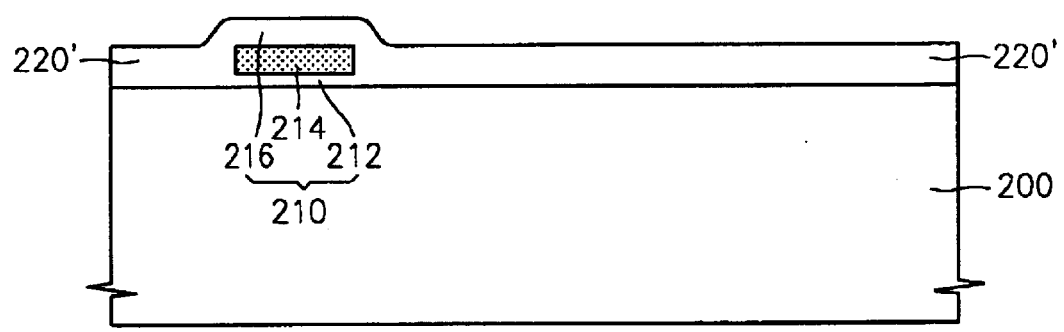

With reference to FIG. 6B, a vertical structure 210 is formed where a tunneling layer 212 formed of a silicon oxide layer pattern, a charge trapping layer 214 formed of an nitride layer pattern, and a blocking layer 216 formed of an oxide layer pattern are sequentially stacked by performing etching using the photoresist layer pattern 600 as the etch mask. The surface where the vertical structure 210 is not placed is exposed. After the photoresist layer pattern 600 is stripped, the silicon oxide layer 220' is formed by applying thermal oxidation to the exposed surface of the semiconductor substrate 200. The silicon oxide layer 220' functions as a gate insulating layer of the SONOS cell and a gate insulating layer of the select transistor. It is possible to perform ion implantation to control the threshold voltage before the thermal oxidation.

Figure 6C:
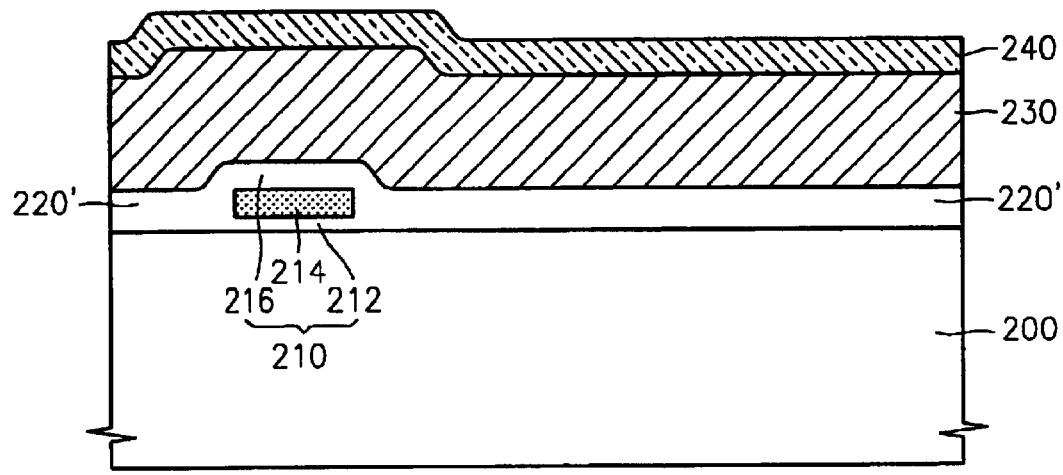

With reference to FIG. 6C, a polysilicon layer 230 as a conductive layer for a gate electrode is formed on the silicon oxide layer 220' and the blocking layer 216. The polysilicon layer 230 can be formed by chemical vapor deposition. In one embodiment, when the chemical vapor deposition is performed, the polysilicon layer 230 is doped with an n-type impurity, i.e., phosphorus, which is formed by mixing a source gas with a phosphine gas which amounts to 10% of the source gas, so that the polysilicon layer 230 can have higher conductivity than an undoped polysilicon. Then, a metal silicide layer 240 is formed on the polysilicon layer 230 so as to reduce the current resistance of the gate line. The metal silicide layer 240 may be a tungsten silicide (WSi) layer, a cobalt silicide (CoSi) layer, or a titanium silicide (TiSi) layer.

Figure 6D:
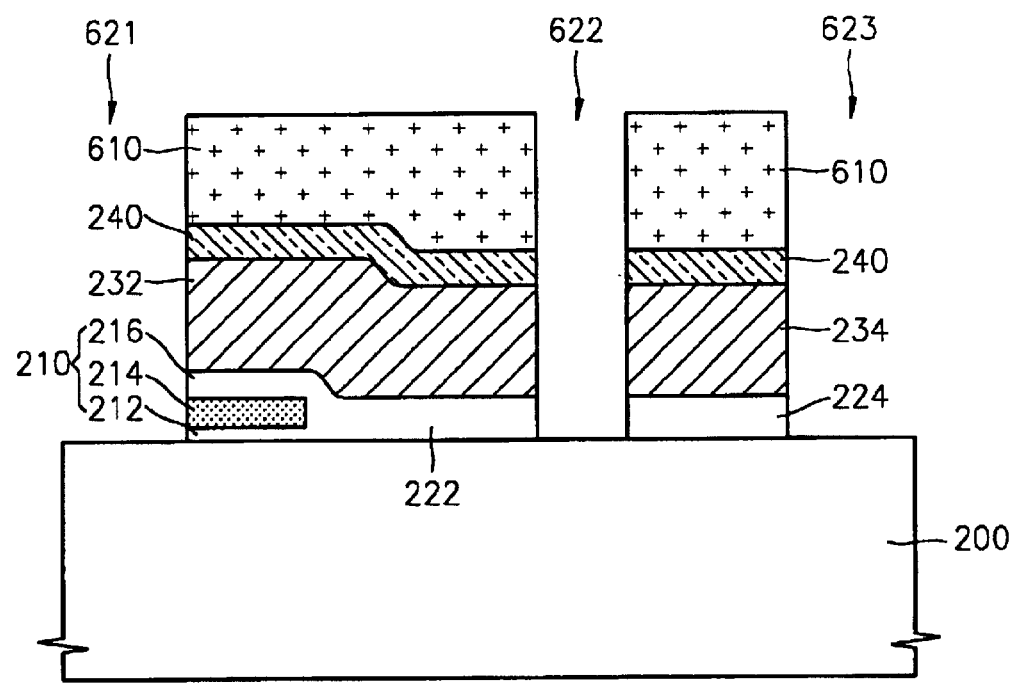

Next, with reference to FIG. 6D, a photoresist layer pattern 610 is formed on the metal silicide layer 240. In order to form the photoresist layer pattern 610, a photoresist layer is formed on the metal silicide layer 240, and then exposure and development are applied to the photoresist layer according to a conventional photolithography process. The resultant, i.e., the photoresist layer pattern 610, includes a first opening 621, a second opening 622, and a third opening 623. The first opening 621 exposes a portion where a source region of a semiconductor substrate 200 will be formed, and the second opening 622 exposes a portion where an impurity region of the semiconductor substrate 200 will be formed. The third opening 623 exposes a portion where a drain region of the semiconductor substrate 200 will be formed. After that, etching is performed by using the photoresist layer pattern 610 as an etching mask, so as to expose the surfaces of the semiconductor substrate 200 which correspond to the first opening 621, the second opening 622, and the third opening 623, respectively. At this time, a control gate electrode 232 and a gate electrode 234 of a select transistor are formed, separated from each other. Likewise, a gate insulating layer 222 under the control gate electrode 232 and a gate insulating layer 224 under the gate electrode 234 are separated from each other.

Then, the photoresist layer pattern 610 is removed, and a conventional ion implantation process is performed. Thus, a source region 202, a drain region 204, and an impurity region 206 are formed on the semiconductor substrate 200, as shown in FIG. 2. Though not shown in FIG. 6D, it is possible to form a metal interconnection to the drain region 204 in a subsequent process.

Figure 7A:
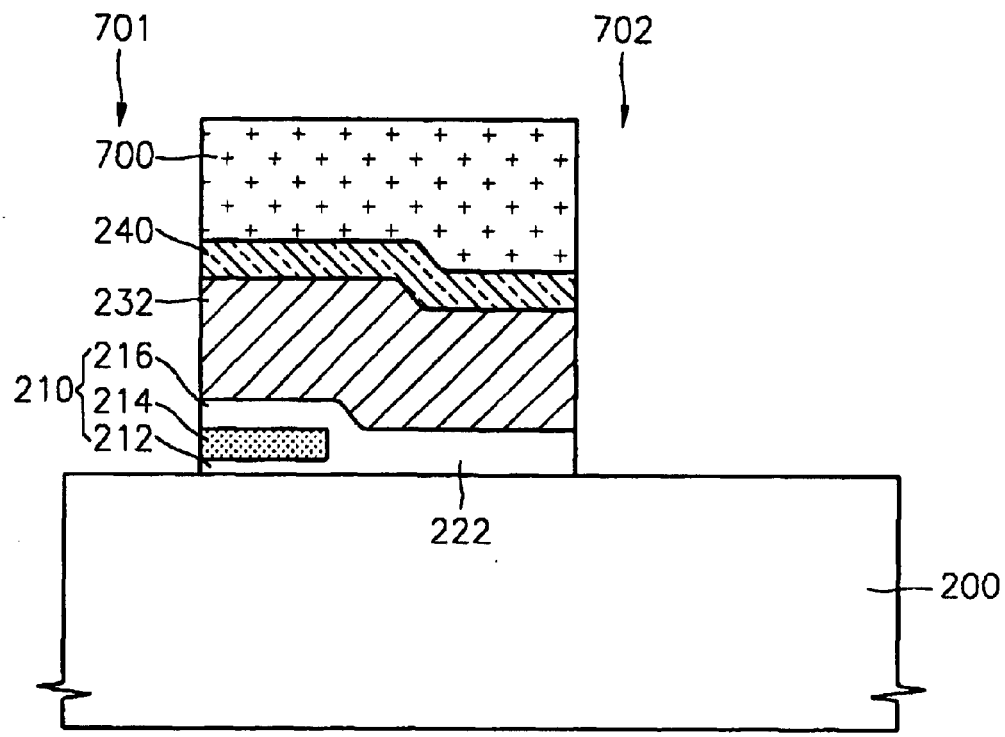
FIGS. 7A through 7C are sectional diagrams illustrating a method for fabricating the non-volatile memory device of FIG. 3.
Figure 7B:
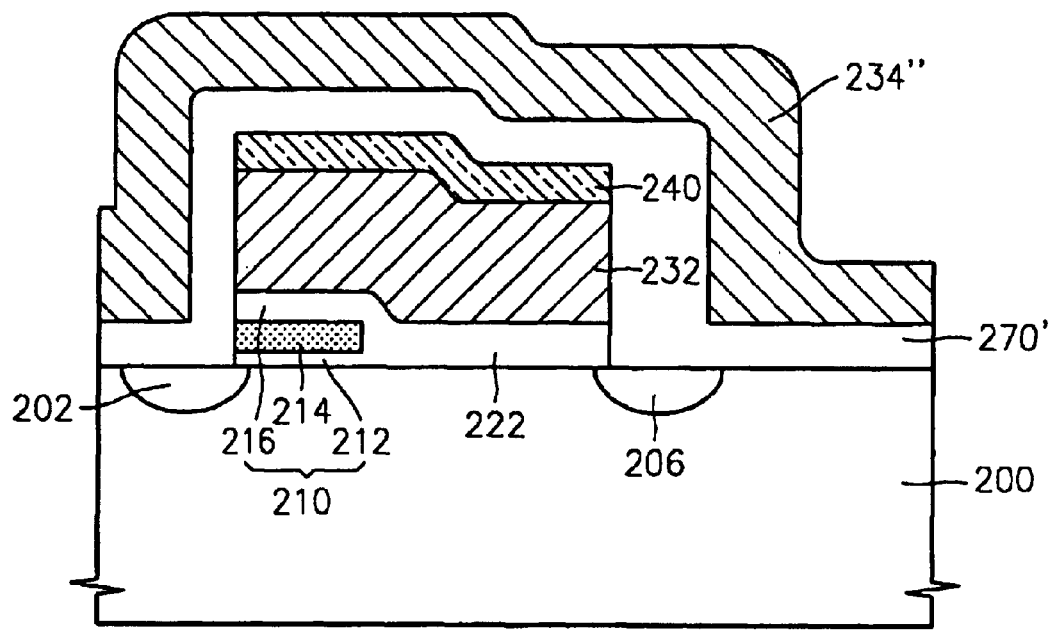
Figure 7C:
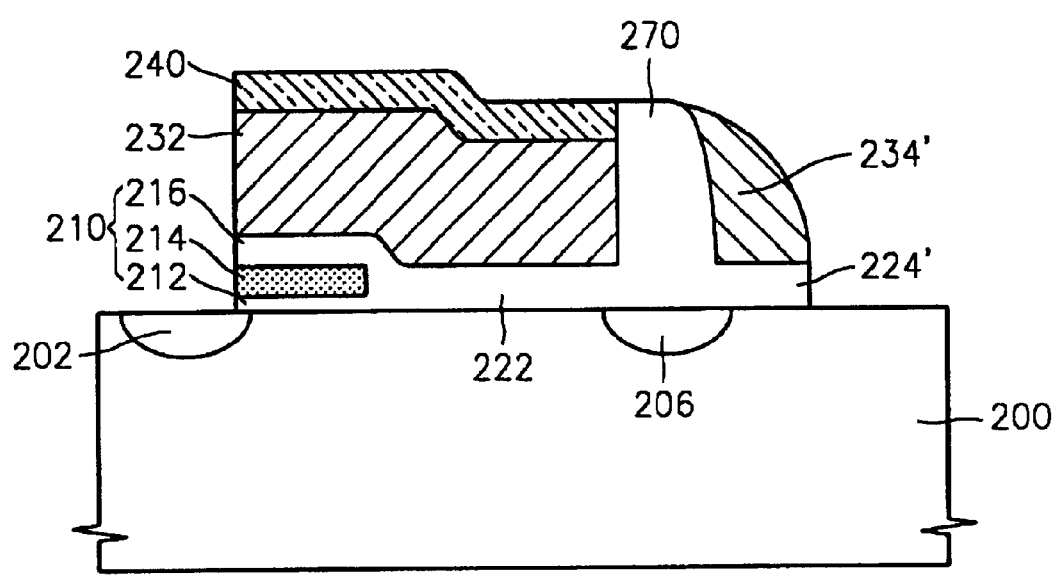

FIGS. 7A through 7C are sectional diagrams helpful in explaining a method for fabricating the non-volatile memory device of FIG. 3.

With reference to FIG. 7A, the same processes are performed as the processes described with reference to FIGS. 6A through 6C. Then, a photoresist layer pattern 700 is formed on a metal silicide layer 240. Unlike FIG. 6D, the photoresist layer pattern 700 includes only a first opening 701 and a second opening 702. The first opening 701 exposes a portion where a source region of a semiconductor substrate 200 will be formed, and the second opening 702 is used in exposing a place where a select transistor and a drain region will be formed. Then, etching is performed by using the photoresist layer pattern 700 as an etching mask, so as to partially expose the semiconductor substrate 200. Here, the control gate electrode 232 and the gate insulating layer 222 under the control gate electrode 232 are defined. The photoresist layer pattern 700 is stripped after etching is completed.

With reference to FIG. 7B, an ion implantation process is performed by using the control gate electrode 232 and a predetermined ion implantation mask (not shown) as masks so as to form a source region 202 and an impurity region 206 on the semiconductor substrate 200. After completion of the ion implantation process, the predetermined ion implantation mask is removed. Then, an insulating layer 270' is formed on the entire surface of the semiconductor substrate 200, and a polysilicon layer 234" as a conductive layer for forming a gate electrode of the select transistor is formed on the insulating layer 270'.

With reference to FIG. 7C, the polysilicon layer 234" of FIG. 7B and the insulating layer 270' of FIG. 7B are partially removed until the metal silicide layer 240 is exposed, by performing anisotropy etching. Then, a gate insulating layer 224' and an insulating layer spacer 270 of the select transistor are formed, and a gate electrode 234' is formed at a sidewall of the insulating layer spacer 270 on the gate insulating layer 224'. The gate electrode 234' of the select transistor is formed by only stacking the polysilicon layer 234" of FIG. 7B and performing anisotropy etching, and thus a gate electrode 234' having a small width can be formed.

Then, an ion implantation process using the predetermined ion implantation mask layer pattern (not shown) as a mask is performed so as to form a drain region 204 on the semiconductor substrate 200. After that, the ion implantation mask layer pattern is removed. Though not shown in FIG. 7C, it is possible to form a metal interconnection to the drain region 204 in a subsequent process.

FIGS. 8A through 8D are sectional diagrams helpful in explaining a method for fabricating the non-volatile memory device of FIG. 4.

With reference to FIG. 8A, an ONO layer 410' is formed on a semiconductor substrate 400 which is formed of silicon. The ONO layer 410' is formed such that a silicon oxide tunneling layer 411, a nitride charge trapping layer 413, and a silicon oxide blocking layer 415 are sequentially stacked on the semiconductor substrate 400. In one embodiment, the tunneling layer 411 can be formed by applying thermal oxidation to the semiconductor substrate 400. For example, the thermal oxidation can be formed under an atmosphere of $N_2O$ gas or NO gas, and the tunneling layer 411 would be formed of oxynitride in such case. The charge trapping layer 413 and the blocking layer 415 are formed by low pressure-chemical vapor deposition (LPCVD). The charge trapping layer 413 may be formed by applying nitridation to the tunneling layer 411. After the ONO layer 410' is formed, mask layer patterns, i.e., photoresist layer patterns 800, are formed on the blocking layer 415. The photoresist layer patterns 800 are formed separated from each other by a predetermined distance to partially cover the blocking layer 415 while exposing the remaining portions of the surface.

With reference to FIG. 8B, etching is performed by using the photoresist layer patterns 800 as an etching mask so as to form a first vertical structure 410 and a second vertical structure 420 that are separated from each other by a predetermined distance. The first vertical structure 410 is formed such that a first tunneling layer 412 formed of a silicon oxide layer pattern, a first charge trapping layer 414 formed of a nitride layer pattern, and a first blocking layer 416 formed of an oxide layer pattern are sequentially stacked on the semiconductor substrate 400. Likewise, the second vertical structure 420 is formed such that a second tunneling layer 422 formed of a silicon oxide layer pattern, a second charge trapping layer 424 formed of a nitride layer pattern, and a second blocking layer 426 formed of an oxide layer pattern are sequentially stacked on the semiconductor substrate 400. Here, the surface of the semiconductor substrate 400 where the first and second vertical structures 410 and 420 are not placed is exposed. After the photoresist layer pattern 800 is stripped, a silicon oxide layer 430' is formed by applying thermal oxidation to the exposed portion of the semiconductor substrate 400. Due to the thermal oxidation, a control gate insulating layer 432 is formed between the first vertical structure 410 and the second vertical structure 420 on the semiconductor substrate 400. The silicon oxide layer 430' functions as the gate insulating layer for two transistors. It is possible to perform an ion implantation process to control a threshold voltage before the thermal oxidation for forming the silicon oxide layer 430'.

With reference to FIG. 8C, a polysilicon layer 440 as a conductive layer for a gate electrode is formed on the control gate insulating layer 432, the silicon oxide layer 430', the first blocking layer 416, and the second blocking layer 426. The polysilicon layer 440 can be formed by chemical vapor deposition. In one embodiment, when chemical vapor deposition is performed, the polysilicon layer 440 is doped with an n-type impurity, i.e., phosphorus, which is formed by mixing a source gas with a phosphine gas which amounts to 10% of the source gas, so that the polysilicon layer 440 can have higher conductivity than an undoped polysilicon. A metal silicide layer 450 is formed on the polysilicon layer 440 so as to reduce the current resistance of the gate line. The metal silicide layer 450 may be a tungsten silicide (WSi) layer, a cobalt silicide (CoSi) layer, or a titanium silicide TiSi layer.

Figure 8D:
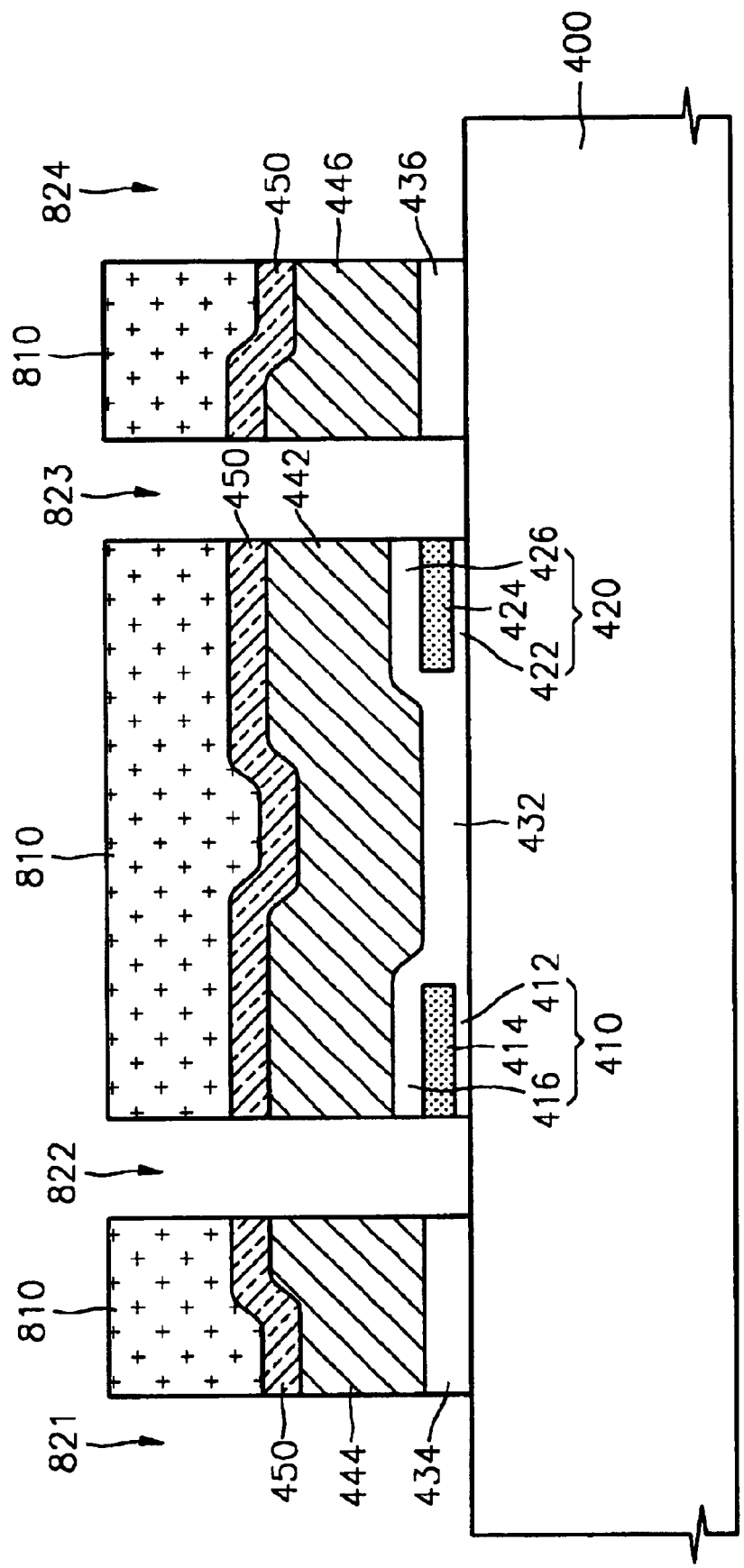

With reference to FIG. 8D, a photoresist layer pattern 810 is formed on the metal silicide layer 450. In order to form the photoresist layer pattern 810, a photoresist layer is formed on the metal silicide layer 450, and then exposure and development are applied to the photoresist layer according to a conventional photolithography process. The resultant, i.e., the photoresist layer pattern 810, includes a first opening 821, a second opening 822, a third opening 823, and a fourth opening 824. The first opening 821 exposes a portion where a source region of the semiconductor substrate 400 will be formed, and the second opening 822 exposes a portion where a first impurity region of the semiconductor substrate 400 will be formed. The third opening 823 exposes a portion where a second impurity region of the semiconductor substrate 400 will be formed, and the fourth opening 824 exposes a portion where a drain region of the semiconductor substrate 400 will be formed. After that, etching is performed by using the photoresist layer pattern 810 as an etching mask, so as to expose the surfaces of the semiconductor substrate 200 which correspond to the first opening 821, the second opening 822, the third opening 823, and the fourth opening 824, respectively. At this time, a control gate electrode 442, a first gate electrode 444 of a first select transistor, and a second gate electrode 446 of a second select transistor are formed, each separated from one another. Likewise, a first gate insulating layer 434 under the first gate electrode 444 of the first select transistor and a second gate insulating layer 436 under the second gate electrode 446 of the second select transistor are separated from the first vertical structure 410 and the second vertical structure 420.

Then, the photoresist layer pattern 810 is removed, and a conventional ion implantation process is performed. Thus, a source region 402, a drain region 404, a first impurity region 406, and a second impurity region 408 are formed on the semiconductor substrate 400, as shown in FIG. 4. Though not shown in FIG. 8D, it is possible to form a metal interconnection to the source region 402 and the drain region 404 in a subsequent process.

Figure 9B:
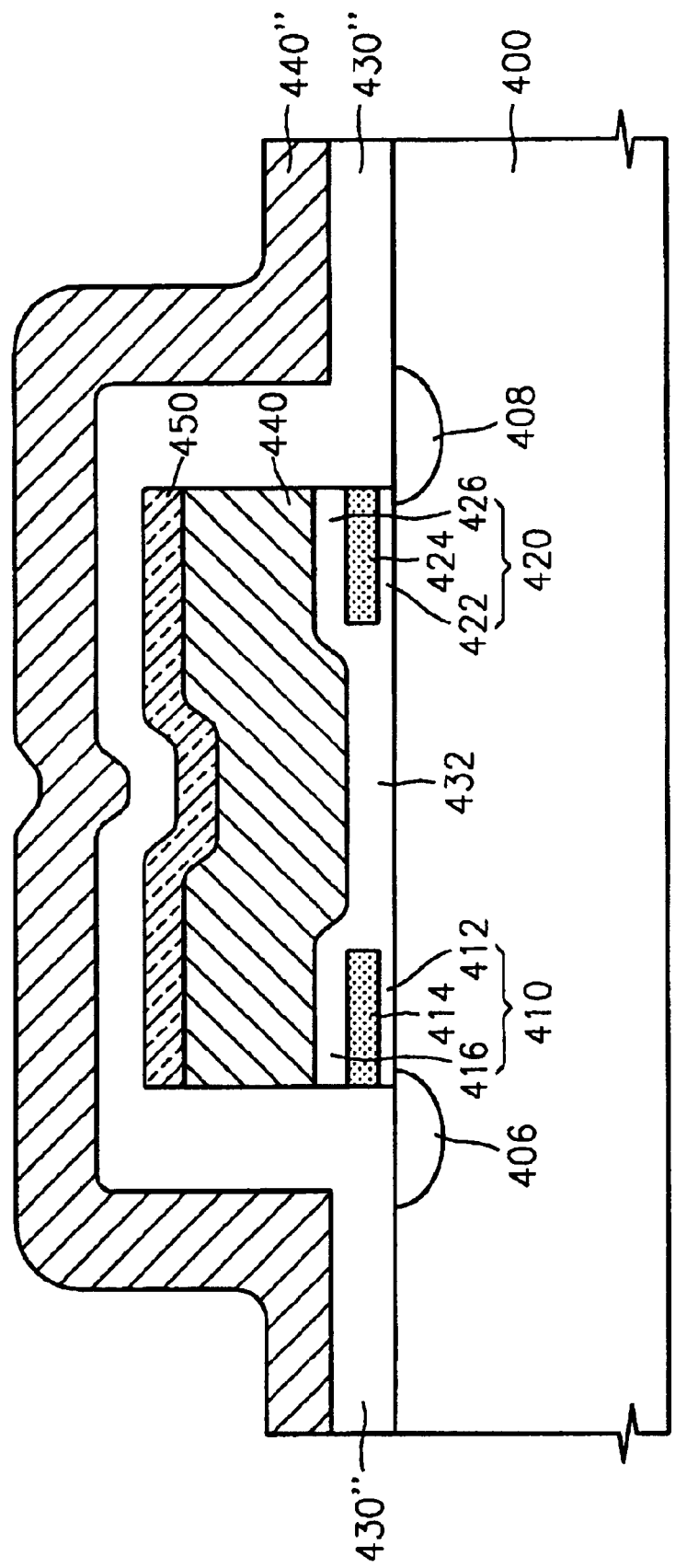
Figure 9C:
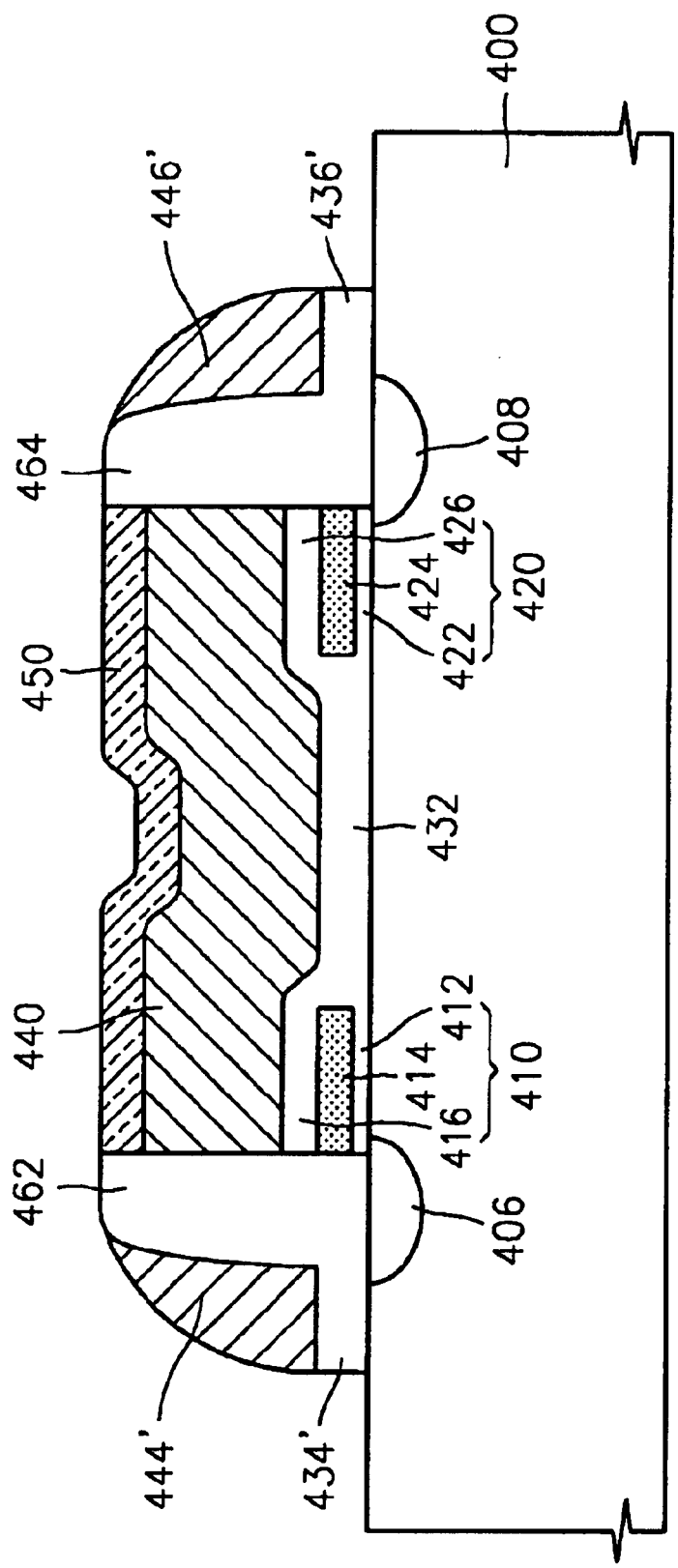

FIGS. 9A through 9C are sectional diagrams helpful in explaining a method for fabricating the non-volatile memory device of FIG. 5.

With reference to FIG. 9A, the same processes are performed as those described with reference to FIGS. 8A through 8C. After that, a photoresist layer pattern 900 is formed on the metal silicide layer 450. Unlike FIG. 8D, the photoresist layer pattern 900 has only a first opening 901 and a second opening 902. The first opening 901 exposes a portion where a source region and a first select transistor will be formed, and the second opening 902 exposes a portion where a second select transistor and a drain region will be formed. Then, etching is performed by using the photoresist layer pattern 900 as an etching mask, so as to partially expose the semiconductor substrate 400. Here, the control gate electrode 440 and the gate insulating layer 432 under the control gate electrode 440 are defined. The photoresist layer pattern 900 is stripped after etching is completed.

With reference to FIG. 9B, an ion implantation process is performed by using the control gate electrode 440 and a predetermined ion implantation mask (not shown) as masks, so as to form a first impurity region 406 and a second impurity region 408 on the semiconductor substrate 400. After completion of the ion implantation process, the implantation mask is removed. Then, an insulating layer 430" is formed on the entire surface of the semiconductor substrate 400, and a polysilicon layer 440" as a conductive layer for forming the first and the second gate electrodes of the first and the second select transistors is formed on the insulating layer 430".

With reference to FIG. 9C, the polysilicon layer 440" of FIG. 9B and the insulating layer 430" of FIG. 9B are partially removed until the metal silicide layer 450 is exposed, by performing anisotropy etching. Then, the first gate insulating layer 434' of the first select transistor and the first insulating layer spacer 462 are formed, and a first gate electrode 444' of the first select transistor is formed on the first gate insulating layer 434' and the first insulating layer spacer 462. Likewise, a second gate insulating layer 436' of the second select transistor and the second insulating layer spacer 464 are formed, and the second gate electrode 446' of the second select transistor is formed on the second gate insulating layer 436' and the second insulating layer spacer 464. The first and the second gate electrodes 444' and 446' of the first and the second select transistors are formed by only deposition and anisotropy etching, and thus first and second gate electrodes 444' and 446' having a small width can be formed.

Then, as shown in FIG. 5, an ion implantation process using the predetermined ion implantation mask layer pattern (not shown) as a mask is performed so as to form a source region 402 and a drain region 404 on the semiconductor substrate 400. After that, the ion implantation mask layer pattern is removed. Though not shown in FIG. 9C, it is possible to perform a metal interconnection to the source region 402 and the drain region 404 in a subsequent process.

Specific embodiments of the invention will now be described in a non-limiting way. According to an aspect of the invention, there is provided a non-volatile memory device including a semiconductor substrate; a source region and a drain region that are formed separated from each other on certain areas of the semiconductor substrate; an impurity region which is formed between the source region and the drain region on a certain area of the semiconductor substrate, the impurity region being in a floating state; a vertical structure which is placed between the source region and the impurity region on a first area of the semiconductor substrate such that a tunneling layer, a charge trapping layer and a blocking layer are sequentially stacked between the source region and the impurity region; a control gate insulating layer which is placed between the source region and the impurity region, the control gate insulating layer being adjacent to the vertical structure; a control gate electrode which is formed on the vertical structure and the control gate insulating layer; a gate insulating layer which is placed between the impurity region and the drain region on the semiconductor substrate; and a gate electrode which is formed on the gate insulating layer. Preferably, the charge trapping layer is nonconductive.

Preferably, the first area in which the vertical structure is formed is adjacent to the source region.

The device further includes a metal silicide layer which is formed on the control gate electrode.

Preferably, the control gate insulating layer is thinner than the vertical structure. The device further includes an insulating layer spacer which is formed at a sidewall towards the impurity region among sidewalls of the vertical structure and the control gate electrode. Preferably, the gate electrode has a sidewall gate structure on the insulating layer spacer.

According to another aspect of the invention, there is provided a non-volatile memory device including a semiconductor substrate; a source region and a drain region which are formed separated from each other on certain areas of the semiconductor substrate; a first impurity region and a second impurity region which are formed between the source region and the drain region on a certain area of the semiconductor substrate, separated from each other, the first impurity region being in a floating state and adjacent to the source region, and the second impurity region being in the floating state and adjacent to the drain region; a first vertical structure which is placed between the first impurity region and the second impurity region on the first region, which is adjacent to the first impurity region, of the semiconductor substrate such that a first tunnelling layer, a first charge layer and a first blocking layer are sequentially stacked; a second vertical structure which is placed between the first impurity region and the second impurity region on the second region, which is adjacent to the second impurity region, of the semiconductor substrate such that a second tunnelling layer, a second charge layer and a second blocking layer are sequentially stacked; a control gate insulating layer which is placed between the first vertical structure and the second structure on the semiconductor substrate; a control gate electrode which is placed on the first vertical structure, the control gate insulating layer, and the second vertical structure; a first gate insulating layer which is placed between the source region and the first impurity region on the semiconductor substrate; a first gate electrode which is formed on the first gate insulating layer; a second gate insulating layer which is placed between the second impurity region and the drain region on the semiconductor substrate; and a second gate electrode which is formed on the second gate insulating electrode.

Preferably, the first charge trapping layer and the second charge trapping layer are nonconductive.

The device further includes a metal silicide layer which is formed on the control gate electrode.

Preferably, the control gate insulating layer is thinner than the first vertical structure and the second vertical structure.

Preferably, the device further includes a first insulating layer spacer which is formed at a sidewall toward the first impurity region among sidewalls of the first vertical structure and the control gate electrode. Preferably, the first gate electrode assumes the form of a sidewall gate on the first insulating layer spacer.

Preferably, the device further includes a second insulating layer spacer which is formed at a sidewall toward the second impurity region among sidewalls of the second vertical structure and the control gate electrode. Preferably, the second gate electrode has a sidewall gate structure on the second insulating layer spacer.

According to still another aspect of the invention, there is provided a method for fabricating a non-volatile memory device, the method includes sequentially forming a first insulating layer for forming a tunnelling layer, a nonconductive substance layer for forming a charge trapping layer, and a second insulating layer for forming a blocking layer on a semiconductor substrate; forming a first mask layer pattern on the second insulating layer; forming a vertical structure where the tunnelling layer, the charge trapping layer and the blocking layer are sequentially stacked, by performing an etching process using the first mask layer pattern as an etching mask; removing the first mask layer pattern after the etching process is completed; forming an oxide layer for forming a control gate insulating layer and a gate insulating layer of a select transistor on the semiconductor substrate exposed by the vertical structure; forming a conductive layer for forming a control gate electrode and a gate electrode of the select transistor on the oxide layer and the vertical structure; forming a second mask layer pattern on the conductive layer; defining the control gate electrode on the vertical structure and the control gate insulating layer on a first region of the semiconductor substrate by performing an etching process using the second mask layer pattern as an etching mask and defining the gate electrode on the gate insulating layer on a second region of the semiconductor substrate; removing the second mask layer pattern; and forming a source region, an impurity region, and a drain region on certain areas of the semiconductor substrate so as to be aligned with the control gate electrode and the gate electrode, by performing an impurity ion implantation process.

Preferably, the first insulating layer is formed of silicon oxide by thermal oxidation, the nonconductive substance layer is formed of nitride by chemical vapor deposition, and the second insulating layer is formed of oxide by chemical vapor deposition.

The method further includes forming a metal silicide layer on the conductive layer. According to still another aspect of the invention, there is provided a method for fabricating a non-volatile memory device, the method including sequentially forming a first insulating layer for forming a tunnelling layer, a nonconductive substance layer for forming a charge trapping layer, and a second insulating layer for forming a blocking layer on a semiconductor substrate; forming a first mask layer pattern on the second insulating layer; forming a vertical structure where the tunnelling layer, the charge trapping layer and the blocking layer are sequentially stacked, by performing an etching process using the first mask layer pattern as an etching mask; removing the first mask layer pattern after the etching process is completed; forming a third insulating layer for forming a control gate insulating layer on the semiconductor substrate exposed by the vertical structure; forming a first conductive layer for forming a control gate electrode on the third insulating layer and the vertical structure; forming a second mask layer pattern on the conductive layer for forming the control gate electrode; defining the control gate electrode on the vertical structure and the control gate insulating layer on a first region of the semiconductor substrate by performing the etching process using the second mask layer pattern as the etching mask; removing the second mask layer pattern; forming an impurity region on a certain area of the semiconductor substrate by performing an ion implantation process using the control gate electrode and a predetermined first ion implantation mask layer as a mask; forming a fourth insulating layer which forms an insulating layer spacer covering the control gate electrode and the semiconductor substrate and forms a gate insulating layer of a select transistor; forming a second conductive layer for forming a gate electrode of the select transistor on the fourth insulating layer; forming an insulating layer spacer at a sidewall of the control gate electrode which is opposite to the vertical structure, by performing an anisotropic etching process on the second conductive layer and the fourth insulating layer, and forming a gate electrode in the form of a sidewall gate on the insulating layer spacer; and forming a source region and a drain region on certain areas of the semiconductor substrate by implanting impurity ion into the semiconductor substrate exposed by the control gate electrode and the gate electrode.

Preferably, the first insulating layer is formed of silicon oxide by thermal oxidation, the nonconductive substance layer is formed of nitride by chemical vapor deposition, and the second insulating layer is formed of oxide by chemical vapor deposition.

The method further includes forming a metal silicide layer on the first conductive layer.

Preferably, the anisotropic etching process performed on the second conductive layer and the fourth insulating layer is performed using an etching back process.

According to still another aspect of the invention, there is provided a method for fabricating a non-volatile memory device, the method including sequentially forming a first insulating layer for forming a tunnelling layer, a nonconductive substance layer for forming a charge trapping layer, and a second insulating layer for forming a blocking layer on a semiconductor substrate; forming a first mask layer pattern on the second insulating layer, the first mask layer pattern covering a first region and a second region of the semiconductor substrate; forming a first vertical structure where a first tunnelling layer, a first charge trapping layer, and a first blocking layer are sequentially stacked on the first region, and forming a second vertical structure where a second tunnelling layer, a second charge trapping layer, and a second blocking layer are sequentially stacked on the second region, by performing an etching process using the first mask layer pattern as an etching mask; removing the first mask layer pattern after the etching process is completed; forming a third insulating layer for forming a control gate insulating layer, a first gate insulating layer of a first select transistor, and a second insulating layer of a second select transistor on the semiconductor substrate exposed by the first vertical structure and the second vertical structure; forming a conductive layer for forming a control gate electrode, a first gate electrode of the first select transistor, and a second gate electrode of the second transistor on the third insulating layer, the first vertical structure, and the second vertical structure; forming a second mask layer pattern on the conductive layer; defining the control gate electrode aligned with the first structure and the second structure, defining the first gate insulating layer and the first gate electrode on the semiconductor substrate which is separated from a sidewall of the control gate electrode, and defining a second gate insulating layer and a second gate electrode on the semiconductor substrate which is separated from the other sidewall of the control gate electrode, by performing an etching process using the second mask layer pattern as the etching mask; removing the second mask layer pattern; and forming a source region, a first impurity region, a second impurity region, and a drain region on certain areas of the semiconductor substrate so as to be aligned with the control gate electrode, the first gate electrode and the second gate electrode, by performing an ion implantation process.

According to still another aspect of the invention, there is provided a method for fabricating a non-volatile memory device, the method including sequentially forming a first insulating layer for forming a tunnelling layer, a nonconductive substance layer for forming a charge trapping layer, and a second insulating layer for forming a blocking layer on a semiconductor substrate; forming a first mask layer pattern on the second insulating layer, the first mask layer pattern covering a first region and a second region of the semiconductor substrate; forming a first vertical structure where a first tunnelling layer, a first charge trapping layer, and a first blocking layer are sequentially stacked on the first region, and forming a second vertical structure where a second tunnelling layer, a second charge trapping layer and a second blocking layer are sequentially stacked on the second region, by performing an etching process using the first mask layer pattern as an etching mask; removing the first mask layer pattern after the etching process is completed; forming a third insulating layer for forming a control gate insulating layer, a first gate insulating layer of a first select transistor, and a second insulating layer of a second select transistor on the semiconductor substrate exposed by the first vertical structure and the second vertical structure; forming a first conductive layer for forming a control gate electrode on the third insulating layer, the first vertical structure, and the second vertical structure; forming a second mask layer pattern on the first conductive layer; defining the control gate electrode on the first vertical structure, the second vertical structure, and the control gate insulating layer on a first region of the semiconductor substrate by performing an etching process using the second mask layer pattern as the etching mask; removing the second mask layer pattern; forming a first impurity region and a second impurity region at both sidewalls of the control gate electrode of the semiconductor substrate by performing an ion implantation process using the control gate electrode and a predetermined ion implantation mask layer as a mask; forming a fourth insulating layer for forming a first gate insulating layer of a first select transistor and a second gate insulating layer of a second select transistor so as to cover the control gate electrode and an exposed portion of the semiconductor substrate; forming a second conductive layer for forming a first gate electrode of the first select transistor and a second gate electrode of the second select transistor on the fourth insulating layer; forming a first insulating spacer and a second insulating spacer at both sidewalls of the control gate electrode by performing an anisotropic etching process on the second conductive layer and the fourth insulating layer, and forming a first gate electrode and a second gate electrode in the form of sidewall gates on the first insulating spacer and the second insulating spacer, respectively; and forming a source region and a drain region on certain regions of the semiconductor substrate by implanting impurity ion into the semiconductor substrate exposed by the control gate electrode, the first gate electrode, and the second gate electrode.

Preferably, the anisotropic etching process performing on the second conductive layer and the fourth insulating layer is performed using an etching back process.

As described above, according to the non-volatile memory device having the select transistor and the SONOS cell structure and the method for fabricating the device, it is possible to perform a programming operation in byte through an appropriate circuit connection means by controlling the programming operation of the SONOS cell through the select transistor. Moreover, the current capacity, which is consumed as the programming operation is performed, can be reduced by controlling the bias voltage applied to the gate electrode of the select transistor, and thus power consumption can be reduced when the programming operation is performed. In addition, the non-volatile memory device and the method for fabricating the device according to the invention can be widely applied to other devices such as embedded devices.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A non-volatile memory device comprising:

a semiconductor substrate;

a source region and a drain region formed in the substrate;

an impurity region formed between the source region and the drain region, wherein the impurity region is in a floating state;

a vertical structure located between the source region and the impurity region on a first area of the semiconductor substrate such that a tunneling layer, a charge trapping layer, and a blocking layer are sequentially stacked between the source region and the impurity region;

a control gate insulating layer located between the source region and the impurity region, the control gate insulating layer adjacent to the vertical structure;

a control gate electrode that is formed on the vertical structure and the control gate insulating layer;

a gate insulating layer located between the impurity region and the drain region on the semiconductor substrate; and a gate electrode on the gate insulating layer.

2. The non-volatile memory device of claim 1, wherein the charge trapping layer is nonconductive.

3. The non-volatile memory device of claim 1, wherein the first area in which the vertical structure is formed is adjacent to the source region.

4. The non-volatile memory device of claim 1, further comprising a metal silicide layer that is formed on the control gate electrode.

5. The non-volatile memory device of claim 1, wherein the control gate insulating layer is thinner than the vertical structure.

6. The non-volatile memory device of claim 1, further comprising an insulating layer spacer located at a sidewall towards the impurity region among sidewalls of the vertical structure and the control gate electrode.

7. The non-volatile memory device of claim 6, wherein the gate electrode has a sidewall gate structure on the insulating layer spacer.

8. A non-volatile memory device comprising:

a semiconductor substrate;

a source region and a drain region;

a first impurity region and a second impurity region between the source region and the drain region, the first impurity region being in a floating state and adjacent to the source region and the second impurity region being in the floating state and adjacent to the drain region;

a first vertical structure between the first impurity region and the second impurity region and adjacent to the first impurity region, the first vertical structure including a first tunneling layer, a first charge trapping layer, and a first blocking layer that are sequentially stacked;

a second vertical structure between the first impurity region and the second impurity region and adjacent to the second impurity region, the first vertical structure including a second tunnelling layer, a second charge trapping layer, and a second blocking layer that are sequentially stacked;

a control gate insulating layer between the first vertical structure and the second vertical structure, a control gate electrode on the first vertical structure, the control gate insulating layer, and the second vertical structure;

a first gate insulating layer between the source region and the first impurity region;

a first gate electrode on the first gate insulating layer;

a second gate insulating layer between the second impurity region and the drain region; and a second gate electrode on the second gate insulating layer.

9. The non-volatile memory device of claim 8, wherein the first charge trapping layer and the second charge trapping layer are nonconductive.

10. The non-volatile memory device of claim 8, further comprising a metal silicide layer on the control gate electrode.

11. The non-volatile memory device of claim 8, wherein the control gate insulating layer is thinner than the first vertical structure and second vertical structure.

12. The non-volatile memory device of claim 8, further comprising a first insulating layer spacer at a sidewall toward the first impurity region among sidewalls of the first vertical structure and the control gate electrode.

13. The non-volatile memory method of claim 12, wherein the first gate electrode has a sidewall gate structure on the first insulating layer space.

14. The non-volatile memory device of claim 8, further comprising a second insulating layer spacer at a sidewall toward the second impurity region among sidewall, of the second vertical structure and the control gate electrode.

15. The non-volatile memory device of claim 14, wherein the second gate electrode has a sidewall gate structure an the second insulating layer spacer.

* * * * *

UNITED STATES PATENT AND TRADEMARK OFFICE
CERTIFICATE OF CORRECTION

PATENT NO. : 6,794,711 B2
DATED : September 21, 2004
INVENTOR(S) : Kang et al.

It is certified that error appears in the above-identified patent and that said Letters Patent is hereby corrected as shown below:

Column 4,
Line 36, "the select transistor" should read -- the select transistor II. --.

Column 5,
Line 56, "transistor II. The" should read -- transistor III. The --.

Column 6,
Line 43, "transistor m. At" should read -- transistor III. At --.

Column 7,
Line 12, "transistor m is" should read -- transistor III is --.
Line 23, "transistor m. Therefore," should read -- transistor III. Therefore, --.
Line 33, "transistor m. Their" should read -- transistor III. Their --.
Line 60, "transistor m is" should read -- transistor III is --.

Column 18,
Line 43, "among sidewall, of" should read -- among sidewalls of --.
Line 46, "gate structure an the" should read -- gate structure on the --.

Signed and Sealed this

Twelfth Day of July, 2005

JON W. DUDAS
*Director of the United States Patent and Trademark Office*